(12) United States Patent
van Dal

(10) Patent No.: US 8,829,606 B1
(45) Date of Patent: Sep. 9, 2014

(54) DITCHES NEAR SEMICONDUCTOR FINS AND METHODS FOR FORMING THE SAME

(71) Applicant: Taiwan Semiconductor Manufacturing Company, Ltd., Hsin-Chu (TW)

(72) Inventor: Mark van Dal, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/838,407

(22) Filed: Mar. 15, 2013

Related U.S. Application Data

(60) Provisional application No. 61/780,847, filed on Mar. 13, 2013.

(51) Int. Cl.
    *H01L 29/66* (2006.01)
    *H01L 21/8238* (2006.01)
    *H01L 29/78* (2006.01)

(52) U.S. Cl.
    CPC ........ *H01L 29/785* (2013.01); *H01L 29/66795* (2013.01)
    USPC .......................................... 257/330; 438/221

(58) Field of Classification Search
    CPC ............... H01L 21/823431; H01L 21/823437; H01L 21/845; H01L 27/0886; H01L 27/1211; H01L 29/41791
    USPC ........................................... 257/330; 438/221
    See application file for complete search history.

(56) References Cited

U.S. PATENT DOCUMENTS

| | | | |
|---|---|---|---|
| 7,196,374 B1 * | 3/2007 | Lin et al. | 257/327 |
| 7,687,862 B2 * | 3/2010 | Huebinger et al. | 257/369 |
| 7,728,381 B2 * | 6/2010 | Kahng et al. | 257/330 |
| 8,062,963 B1 | 11/2011 | van Dal | |
| 8,263,462 B2 * | 9/2012 | Hung et al. | 438/286 |
| 2012/0217611 A1 * | 8/2012 | Liu et al. | 257/508 |
| 2012/0319211 A1 | 12/2012 | van Dal et al. | |

\* cited by examiner

*Primary Examiner* — William D Coleman
(74) *Attorney, Agent, or Firm* — Slater and Matsil, L.L.P.

(57) ABSTRACT

A device includes a semiconductor substrate, and isolation regions extending into the semiconductor substrate. A semiconductor strip is between and contacting the isolation regions. A semiconductor fin overlaps, and is joined to, the semiconductor strip. A ditch extends from a top surface of the isolation regions into the isolation regions, wherein the ditch adjoins the semiconductor fin.

20 Claims, 12 Drawing Sheets

DITCHES NEAR SEMICONDUCTOR FINS AND METHODS FOR FORMING THE SAME

This application claims the benefit of U.S. Provisional Application No. 61/780,847, filed on Mar. 13, 2013, entitled "Ditches Near Semiconductor Fins and Methods for Forming the Same", which application is hereby incorporated herein by reference.

BACKGROUND

The speed of metal-oxide-semiconductor (MOS) transistors are closely related to the drive currents of the MOS transistors, which are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming their high electron mobility and/or hole mobility.

Germanium, silicon germanium, and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Semiconductor fins, Fin Field-Effect Transistors (FinFETs), and the methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1:
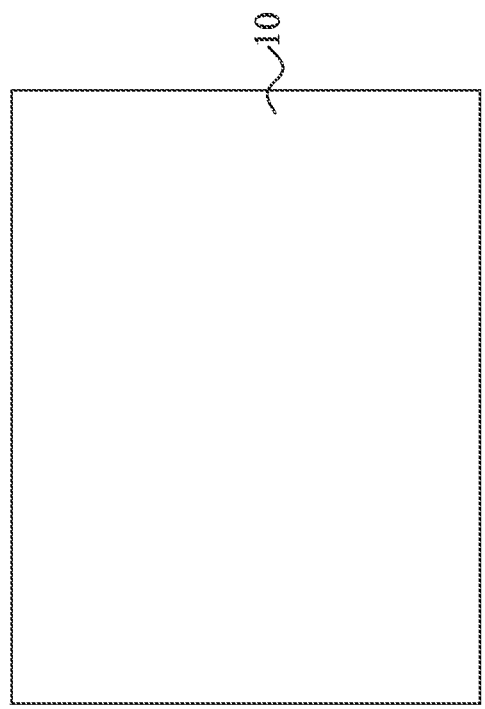
FIGS. 1 through 9 include cross-sectional views and a top view of intermediate stages in the manufacturing of a semiconductor fin and a Fin Field-Effect Transistor (FinFET) in accordance with some exemplary embodiments.
Figure 2:
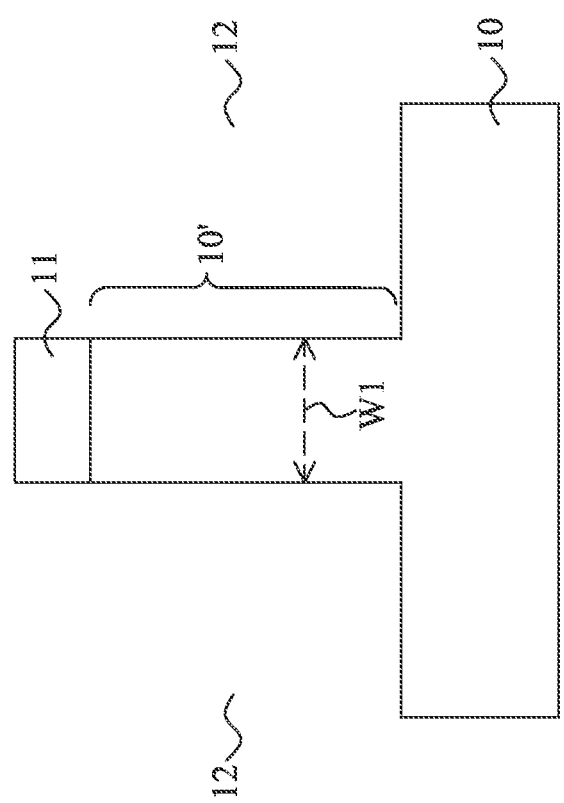

Referring to FIG. 1, substrate 10 is provided. Substrate 10 may be a semiconductor substrate such as a crystalline silicon substrate. Next, as shown in FIG. 2, substrate 10 is etched to form trenches 12, which extend from the top surface of substrate 10 into substrate 10. The portion of substrate 10 between neighboring trenches 12 is referred to as semiconductor strip 10' hereinafter. Hard mask 11 may be formed to define the patterns of trenches 12 and semiconductor strip 10', wherein substrate 10 is etched using hard mask 11 as an etching mask. Hard mask 11 may comprise, for example, silicon nitride, silicon oxide, or multi-layers thereof. In some exemplary embodiments, hard mask 11 includes a silicon oxide layer as a pad oxide layer, and a silicon nitride layer over the silicon oxide layer.

Trenches 12 include neighboring portions on the opposite sides of semiconductor strip 10'. Width W1 of substrate portions 10' may be between about 5 nm and about 200 nm, although different values may be used. The neighboring trenches 12 may be physically disconnected from each other, or may be portions of a continuous trench, which may form a trench ring encircling semiconductor strip 10' in some embodiments.

Figure 3:
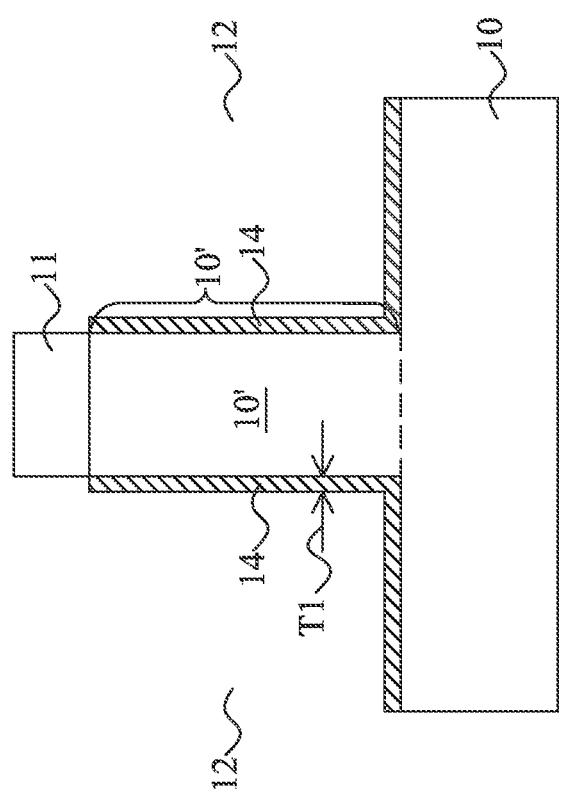
Figure 4:
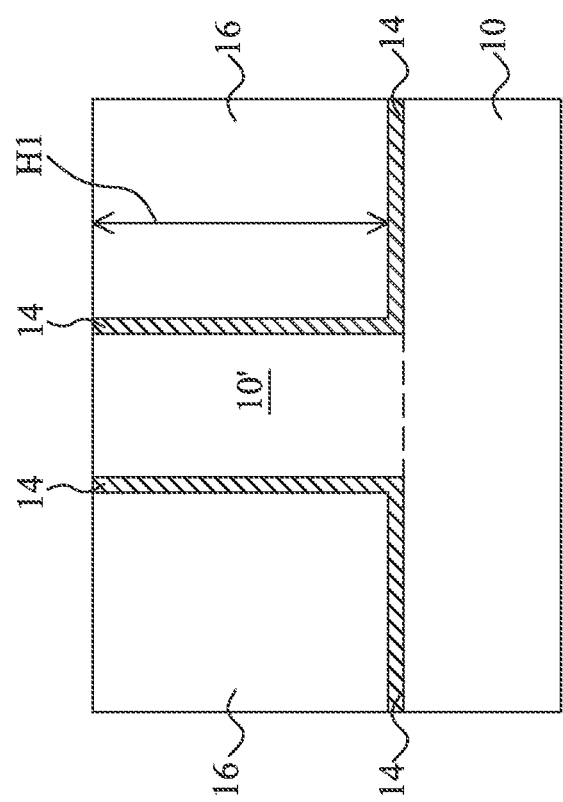
Figure 5:
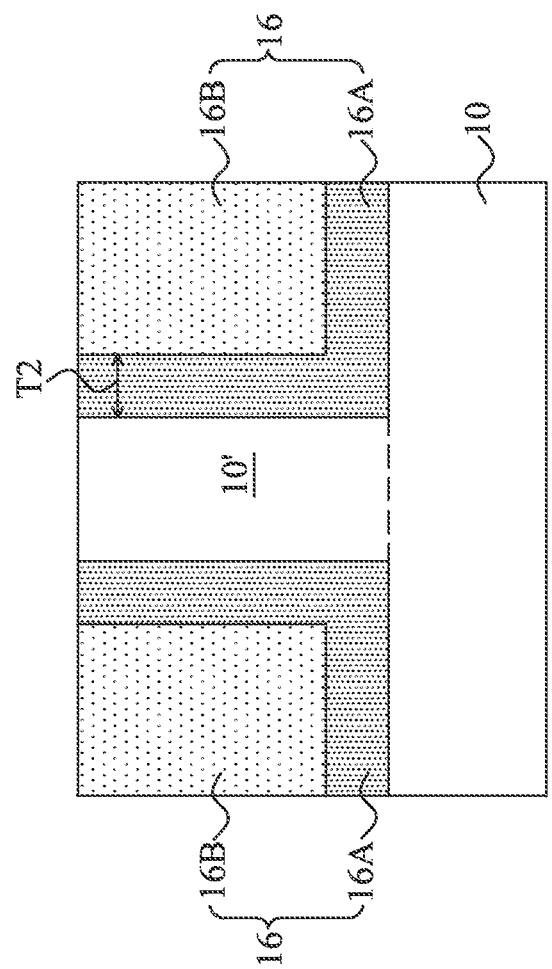

FIGS. 3 through 5 illustrate the steps for forming germanium-containing Shallow Trench Isolation (STI) portions 16A (FIG. 5) in accordance with some embodiments. Referring to FIG. 3, germanium-containing layer 14 is formed, for example, using a deposition method such as Chemical Vapor Deposition (CVD). In some embodiments, germanium-containing layer 14 comprises pure germanium or substantially pure germanium, wherein the substantially pure germanium may have a germanium percentage greater than about 90 percent. In alternative embodiments, germanium-containing layer 14 comprises silicon germanium, wherein the germanium concentration may be, for example, between about 10 percent and about 20 percent. Thickness T1 of germanium-containing layer 14 may be between about 0.5 nm and about 5 nm. It is appreciated that the values recited in the description are merely examples, and may be changed to different values. The thicknesses of the vertical portions and the horizontal portions of germanium-containing layer 14 may be close to each other, and hence germanium-containing layer 14 may be a conformal layer. In some embodiments, germanium-containing layer 14 is formed selectively on the exposed surfaces of substrate 10, and not on hard mask 11. In alternative embodiments, germanium-containing layer 14 is formed on the surfaces of both substrate 10 and hard mask 11.

FIG. 4 illustrates the formation of STI regions 16, which is formed by filling trenches 12 (FIG. 3) with dielectric materials such as silicon oxide. The formation method may be selected from High-Density Plasma Chemical Vapor Deposition (HDPCVD), Flowable Chemical Vapor Deposition (FCVD), or other applicable methods. A Chemical Mechanical Polish (CMP) is then performed to remove excess portions of the dielectric materials, and the remaining portions are STI regions 16. The resulting height H1 of STI regions 16 may be between about 100 nm and about 400 nm, or greater than 400 nm. Hard mask 11 in FIG. 3 may then be removed.

Next, an annealing is performed, so that the germanium atoms in germanium-containing layer 14 diffuse into STI regions 16. The resulting structure is shown in FIG. 5. STI regions 16 hence comprise germanium-containing STI portions 16A and germanium-free STI portions 16B, wherein germanium-free STI portions 16B are formed overlapping the bottom portions of germanium-containing STI portions 16A. Furthermore, germanium-containing STI portions 16A may encircle germanium-free STI portions 16B. Accordingly, germanium-containing STI portions 16A in each of STI regions 16 may form a basin, with a germanium-free STI portion 16B in the basin. In some embodiments, the annealing is performed at a temperature between about 400° C. and about 900° C. The annealing duration may be between about 10 seconds and about 5 minutes. Thickness T2 of the resulting germanium-containing STI portions 16A may be about 2 nm and about 20 nm in accordance with some exemplary embodiments, although thickness T2 may be greater or smaller, depending on the annealing time and the thickness of germanium-containing layer 14 (FIG. 4).

Figure 6:
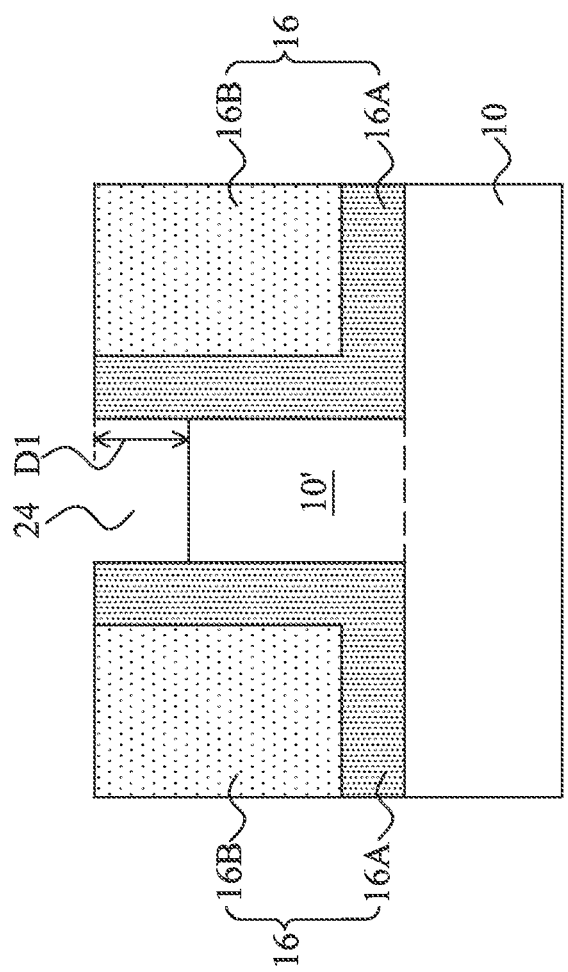

Referring to FIG. 6, substrate portion 10' is recessed, forming recess 24 between neighboring STI regions 16. In some embodiments, the bottom of recess 24 is higher than the bottom surfaces of STI regions 16. In alternative embodiments, the bottom of recess 24 is substantially level with or lower than the bottoms of STI regions 16. In some exemplary embodiments, depth D1 of recess 24 is between about 20 nm and about 400 nm. The recessing may be performed, for example using a dry etching method, with $CF_4$ as an etchant gas or gaseous HCl.

Figure 7:
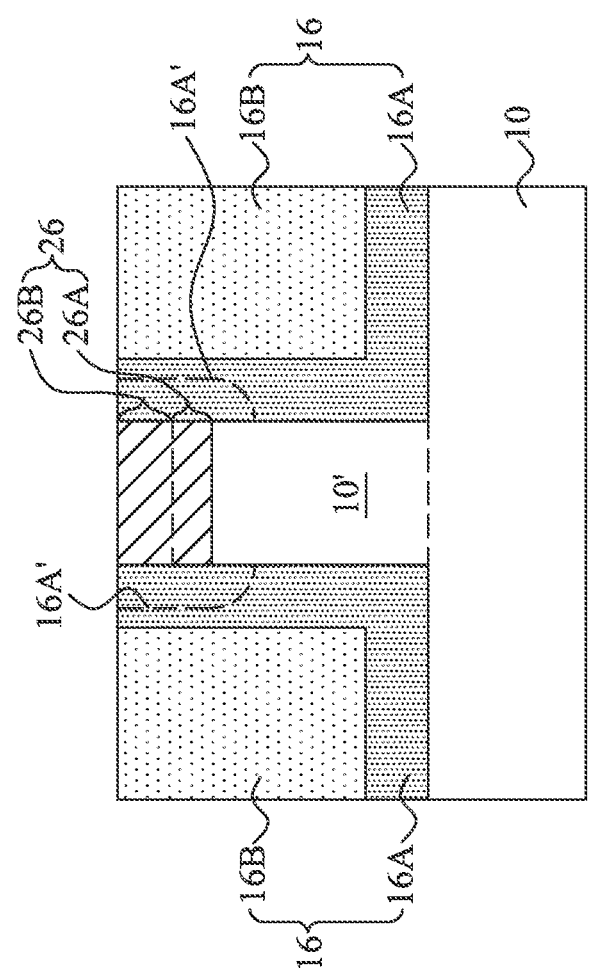

Referring to FIG. 7, epitaxy semiconductor region 26 is grown in recess 24 through epitaxy. The top surface of epitaxy semiconductor region 26 may be level with the top surfaces of STI regions 16. Epitaxy semiconductor region 26 may have a lattice constant greater than or smaller than the lattice constant of substrate 10. In some embodiments, epitaxy semiconductor region 26 comprises silicon germanium, which is expressed as $Si_{1-x}Ge_x$, wherein value X is the atomic percentage of germanium in epitaxy semiconductor region 26, which atomic percentage may be greater than about 0.1 (10 percent) and lower than 1.0 (100 percent) in some exemplary embodiments. In alternative embodiments, epitaxy semiconductor region 26 comprises pure germanium or substantially pure germanium (wherein value X is equal to or substantially equal to 1.0). In yet alternative embodiments, epitaxy semiconductor region 26 does not comprise germanium, and may comprise, for example, silicon carbon, silicon phosphorous, a III-V compound semiconductor, or another semiconductor material.

In some embodiments in which epitaxy semiconductor region 26 comprises germanium, epitaxy semiconductor region 26 may comprise lower portion 26A and upper portion 26B, with upper portion 26B having a germanium percentage greater than the germanium percentage of lower portion 26A. For example, lower portion 26A may include $Si_{1-x1}Ge_{x1}$, and upper portion 26B includes $Si_{1-x2}Ge_{x2}$, wherein value X2 is greater than value X1. In alternative embodiments, lower portion 26A comprises silicon germanium, while upper portion 26B comprises substantially pure germanium. In other embodiments, an entirety of epitaxy semiconductor region 26 is formed of a homogenous germanium-containing material.

The growth of epitaxy semiconductor region 26 may be performed using selective epitaxy, in which a germanium-containing precursor such as germane ($GeH_4$) is used as the germanium source. In addition, in the embodiments in which epitaxy semiconductor region 26 comprises silicon, precursors such as silane ($SiH_4$) and dichloro-silane (DCS) may be added as the silicon source. The temperature of the epitaxy may be between about 400° C. and about 600° C. In some embodiments, the growth rate of epitaxy semiconductor region 26 is adjusted to a low level. For example, the deposition rate of epitaxy semiconductor region 26 may be adjusted to be lower than about 10 Å/second.

Epitaxy semiconductor region 26 may be grown to a level higher than the top surfaces of STI regions 16. A CMP is then performed to level the top surfaces of STI regions 16 and epitaxy semiconductor region 26. The resulting structure is shown in FIG. 7. In alternative embodiments, the growth of epitaxy semiconductor region 26 is stopped when the top surface of epitaxy semiconductor region 26 is level with or lower than the top surfaces of STI regions 16. In these embodiments, the CMP may be performed, or may be skipped. In some embodiments, after the formation of epitaxy semiconductor region 26, an annealing step is performed. The annealing may be performed at a temperature between about 400° C. and about 600° C., or higher than 600° C., for example, between about 600° C. and about 900° C. The annealing may be performed for a period of time between about 0.5 minutes and about 30 minutes.

Figure 8A:
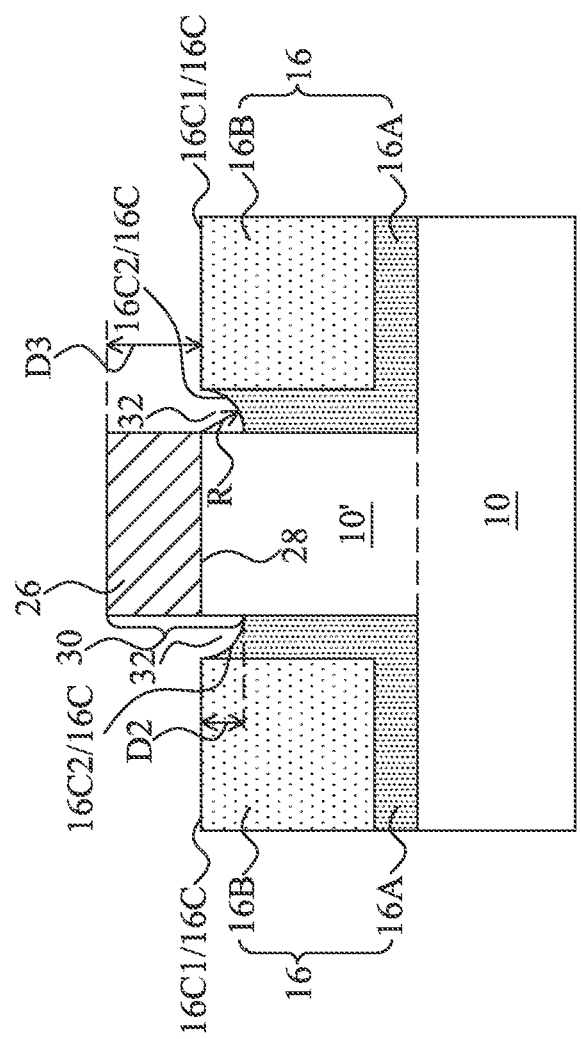

Referring to FIG. 8A, STI regions 16 are recessed, for example, through an etching step. The portions of semiconductor region 26 and substrate portion 10' that are higher than top surfaces 16C of the resulting STI regions 16 are referred to as semiconductor fin 30 hereinafter. The recessing of STI regions 16 may be through an isotropic etching. In some embodiments, the recessing of STI regions 16 comprises a wet etching using a Hydrogen Fluoride (HF) solution, which may have an HF concentration between about 0.3 percent and about 5 percent. The HF concentration may also be between about 1.5 percent and about 2.5 percent.

As a result of the etching, top surfaces 16C of STI regions 16 includes portions 16C1 that are substantially flat. Top surfaces 16C further include portions 16C2 connecting the bottom of fin 30 to portions 16C1. Portions 16C2 and 16C1 are the top surfaces of germanium-containing STI portions 16A and germanium-free STI portions 16B, respectively. Top surface portions 16C2 may have a gradually increased height, with the height gradually increases from the regions closer to fin 30 to the regions farther away from fin 30. In addition, the profile of surface portions 16C2 may be rounded, and may have a shape close to a quarter of a circle, with the radius R of the circle being between about 2 nm and about 20 nm, for example.

Ditches 32 are formed close to fin 30, wherein surface portions 16C2, which are the portions of top surfaces of STI regions 16, are inside and exposed to ditches 32. Ditches 32 may have depth D2 between about 5 nm and about 20 nm. Alternatively, ditches 32 may also be smaller than about 5 nm or greater than about 20 nm.

The mechanism for the formation of ditches 32 is not fully understood. A possible explanation is that germanium-containing STI regions 16A have a higher etching rate than germanium-free STI regions 16B. Accordingly, the process steps may be adjusted to form germanium-containing STI regions 16A. For example, the step shown in FIG. 3 is performed, and germanium-containing layer 14 is formed, so that germanium-containing STI regions 16A may be formed through the diffusion of germanium-containing layer 14. In these embodiments, since germanium-containing STI regions 16A are formed through the formation of germanium-containing layer 14, the material of epitaxy semiconductor region 26 may be selected to comprise germanium, or may be germanium-free. In alternative embodiments, the step shown in FIG. 3 and the subsequent annealing for diffusing germanium-containing layer 14 are skipped. In these embodiments, the materials of epitaxy semiconductor region 26 (FIG. 7) are selected to comprise germanium-containing regions, and an annealing may be performed after the formation of epitaxy semiconductor region 26 in order to form germanium-containing STI regions. In these embodiments, however, as shown in FIG. 7, germanium-containing STI regions 16A' are formed adjoining epitaxy semiconductor region 26. In portions of STI regions 16 adjoining non-germanium containing regions (such as on the sidewalls of substrate portion 10' and at the bottoms of STI regions 16), no germanium-containing STI regions 16A' are formed. The resulting germanium-containing STI regions 16A' are schematically in FIG. 7.

Figure 8B:
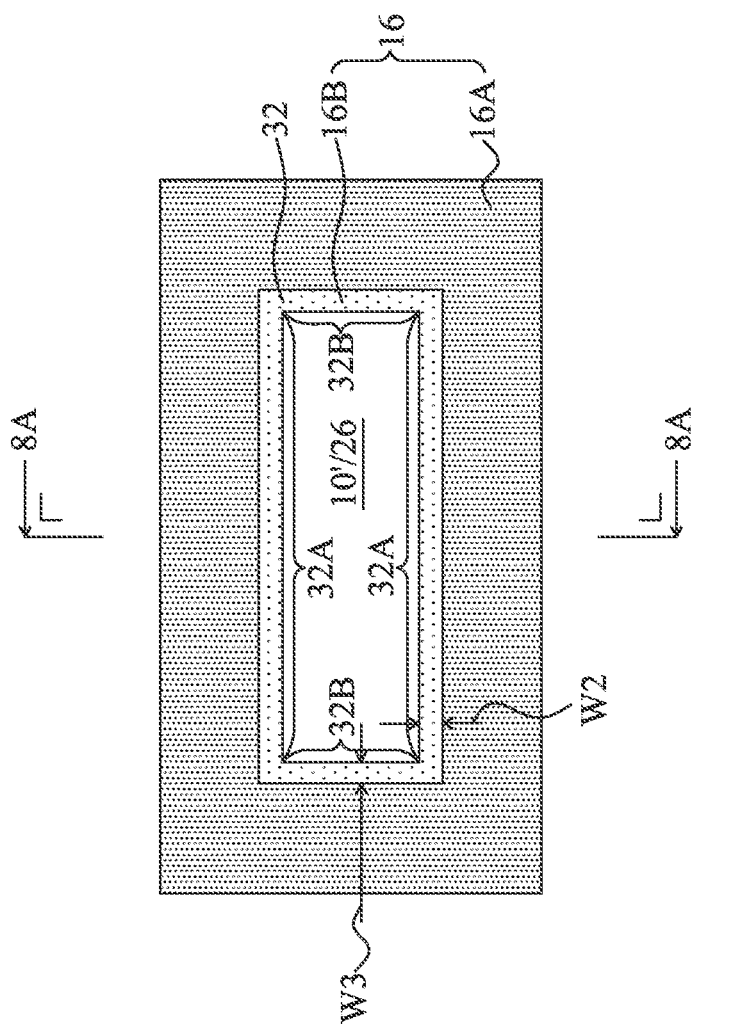

FIG. 8B illustrates a top view of the structure in FIG. 8A, wherein the cross-sectional view in FIG. 8A is obtained from the plane crossing line 8A-8A in FIG. 8B. As shown in FIG. 8B, STI regions 16 may form an STI ring encircling the entire substrate portion 10'. Ditch(es) 32 may form an integrated ditch encircling the entire substrate portion 10'. In some embodiments, ditches 32 have substantially uniform widths W2 and W3. In alternative embodiments, width W3, which is the width of portions 32B of ditch 32, is greater than width W2, which is the width of portions 32A of ditch 32. Portions 32B are close to and adjoining the short sides of substrate strips 10', while portions 32A are close to and adjoining the long sides of substrate strips 10'. Ratio W3/W2 may be between about 0.5 and about 2 in accordance with some embodiments. In addition, ditch portions 32B may have a depth greater than the depth of ditch portions 32A.

In accordance with some embodiments, various methods and/or process conditions are adjusted to form and to increase the depth D2 (FIG. 8A) of ditches 32. For example, increasing the temperature in the epitaxy of epitaxy semiconductor region 26, performing the annealing after the epitaxy, reducing the growth rate of epitaxy semiconductor region 26, and/or increasing the germanium concentration in epitaxy semiconductor region 26 may result in the formation of ditches 32 and the increase in depth D2 of ditches 32. Furthermore, the formation of ditches 32 and the increase in depth D2 may be achieved by increasing the etching selectivity of germanium-containing STI portions 16A and germanium-free STI portions 16B. The increase in the etching selectivity may be achieved by selecting and tuning the etchant process and the etchant composition for etching STI regions 16. It is appreciated that the formation of ditches 32 may be affected by several factors, and ditches 32 may not be formed if these factors as a combination do not satisfy the required conditions. Hence, the optimum formation condition of ditches 32 may be found through experiments.

Figure 9:
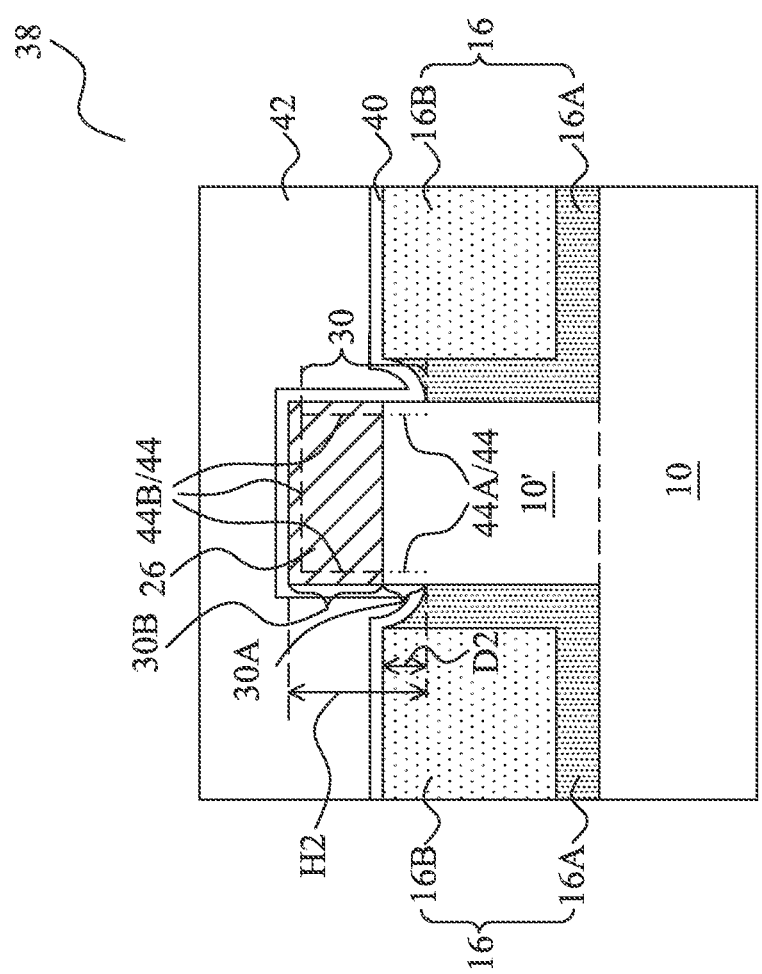

The structure shown in FIGS. 8A and 8B may be used to form FinFET 38, as shown in FIG. 9. Referring to FIG. 9, gate dielectric 40 and gate electrode 42 are formed. Gate dielectric 40 may be formed of a dielectric material such as silicon oxide, silicon nitride, an oxynitride, multi-layers thereof, and/or combinations thereof. Gate dielectric 40 may also be formed of high-k dielectric materials. The exemplary high-k materials may have k values greater than about 4.0, or greater than about 7.0. Gate electrode 42 may be formed of a conductive material selected from doped polysilicon, metals, metal nitrides, metal silicides, and the like. After the formation of gate dielectric 40 and gate electrode 42, source and drain regions (not shown) are formed.

As shown in FIG. 9, the formation of ditches 32 (FIG. 8A) results in the increase of fin height H2 by the height of depth D2 of ditches 32 compared to if ditches 32 are not formed. The on-current of FinFET 38 is hence increased without causing the increase in recessing depth D3 (FIG. 8A).

Furthermore, in accordance with some embodiments, as shown in FIG. 9, fin 30 has a heterogeneous structure, with the lower portion 30A having a greater bandgap than the upper portion 30B. The channel 44 of FinFET includes lower channel portions 44A and upper channel portions 44B. The lower channel portions 44A form a first sub-FinFET with gate dielectric 40 and gate electrode 42, wherein the first sub-FinFET has a first threshold voltage Vt1. The upper channel portions 44B form a second sub-FinFET with gate dielectric 40 and gate electrode 42, wherein the second sub-FinFET has a second threshold voltage Vt2. Threshold voltage Vt2 is lower than threshold voltage Vt1 in some embodiments. The advantageous feature of the corresponding FinFET 38 is illustrated in FIG. 10.

Figure 10:
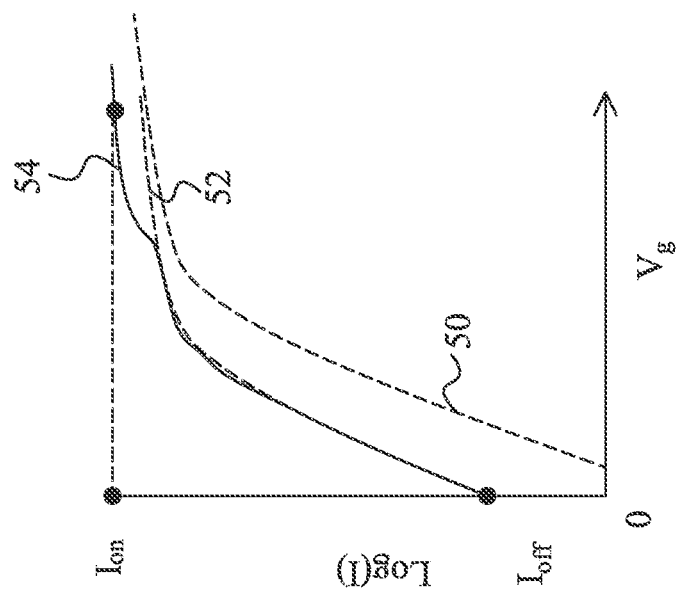
FIG. 10 illustrates an I-V curve of a FinFET in accordance with some embodiments.

In FIG. 10, the current I flowing between the source and drain region of FinFET 38 (FIG. 9) is illustrated as a function of the gate voltage (Vg) applied on gate electrode 42 (FIG. 9). Lines 50 and 52 are I-V curves of the first sub-FinFET (having channel portions 44A) and the second sub-FinFET (having channel portions 44B), respectively, and line 54 is the I-V curve of FinFET 38. It is observed that the off-state current IOff (corresponding to low gate voltages Vg) of FinFET 38 is the sum of the leakage currents of the first and the second sub-FinFETs, and is mainly determined by the leakage current (line 52) of the second sub-FinFET due to its lower threshold voltage Vt1. Since the off-state current of the second sub-transistor is very low, the leakage current of FinFET 38 is low. On the other hand, the on-current of FinFET 38 is the sum of, and is affected by, both the on-currents of the first and the second sub-FinFETs. The on-current of FinFET 38 is hence high. As shown in FIG. 10, when gate voltage Vg reaches a certain level, there is a noticeable current jump. Hence, FinFET 38 has a high on-current and a low leakage current.

Figure 11:
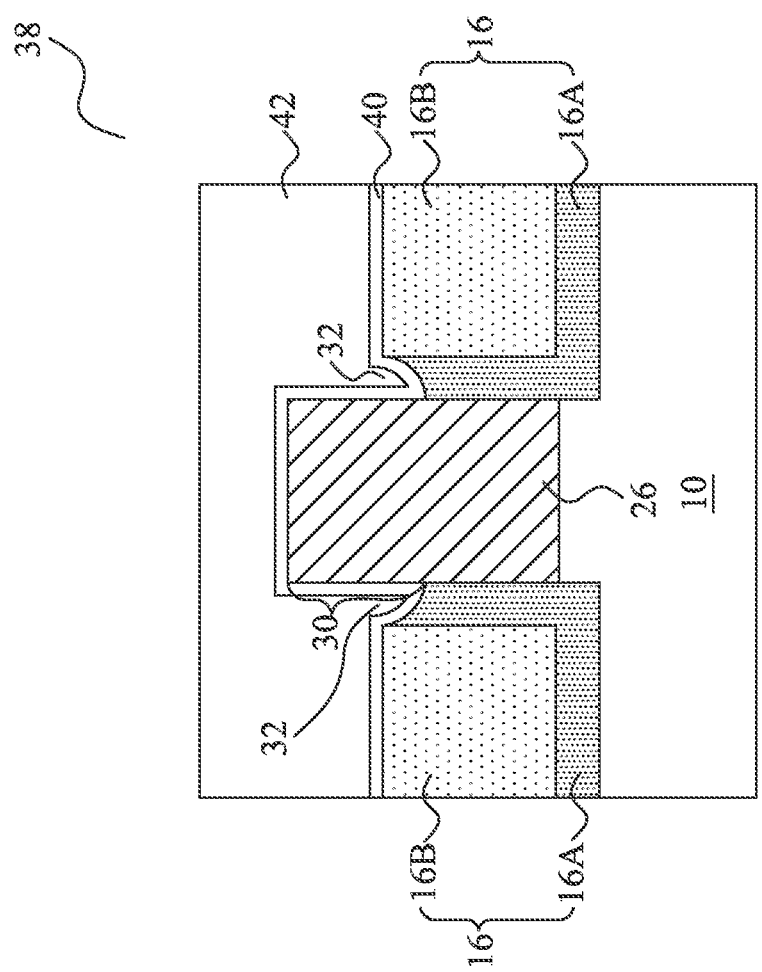
FIG. 11 illustrates a cross-sectional view of a FinFET in accordance with alternative embodiments, wherein a germanium-containing region extends to below a bottom of a ditch.

FIG. 11 illustrates FinFET 38 in accordance with alternative embodiments. In these embodiments, semiconductor fin 30 has a homogenous structure comprising, for example, silicon geranium or substantially germanium. In the embodiments wherein pure or substantially pure germanium is used to form semiconductor fin 30, epitaxy semiconductor region 26 has a bottom lower than the bottoms of ditches 32, so that the defects in the re-grown epitaxy semiconductor region 26 are limited to the portions lower than the channel region of FinFET 38.

In the embodiments of the present disclosure, by forming ditches in STI regions, the heights of semiconductor fins are increased, resulting in an increase in the on-currents of the FinFETs. The recessing distance of STI regions, however, does not need to be increased. Hence, the increase in the on-current is obtained without the cost of process difficulty. In addition, the formation of the ditches does not require additional etching process and additional lithography masks. Hence, the manufacturing cost of the embodiments of the present disclosure is low.

In accordance with some embodiments, a device includes a semiconductor substrate, and isolation regions extending into the semiconductor substrate. A semiconductor strip is between and contacting the isolation regions. A semiconductor fin overlaps, and is joined to, the semiconductor strip. A ditch extends from a top surface of the isolation regions into the isolation regions, wherein the ditch adjoins the semiconductor fin.

In accordance with other embodiments, a device includes a silicon substrate, STI regions extending into the silicon substrate, and a semiconductor fin between the STI regions. The semiconductor fin is higher than neighboring portions of the STI regions. The STI regions comprise a top surface, which further includes a first portion being substantially flat, and a second portion connecting a bottom of the fin to the first portion of the top surface. The second portion of the top surface is lower than the first portion of the top surface.

In accordance with yet other embodiments, a method includes recessing a portion of a semiconductor substrate between isolation regions to form a recess in the semiconductor substrate. An epitaxy is performed to grow a semiconductor region in the recess. The isolation regions are recessed, wherein a top portion of the semiconductor region over the isolation regions forms a semiconductor fin. A ditch is formed simultaneously when the step of recessing the isolation regions is performed, with the ditch being in the isolation regions and adjoining the semiconductor fin.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   isolation regions extending into the semiconductor substrate;
   a semiconductor strip between and contacting the isolation regions; and
   a semiconductor fin overlapping and joined to the semiconductor strip, wherein a ditch extends from a top surface of the isolation regions into the isolation regions, and wherein the ditch adjoins the semiconductor fin.

2. The device of claim 1, wherein the ditch forms a full ring encircling the semiconductor fin, with all edges of the semiconductor fin adjoining the ditch.

3. The device of claim 1, wherein the ditch has a gradually changed depth, with portions of the ditch closer to the semiconductor fin having greater depths than portions of the ditch farther away from the semiconductor fin.

4. The device of claim 1, wherein the ditch has a cross-sectional shape close to a quarter of a circle.

5. The device of claim 1, wherein the semiconductor fin has a long edge and a short edge, and wherein the ditch comprises:
   a first portion adjoining the long edge, wherein the first portion has a first width; and
   a second portion adjoining the short edge, wherein the second portion has a second width greater than the first width.

6. The device of claim 1, wherein the semiconductor fin has a long edge and a short edge, and wherein the ditch comprises:
   a first portion adjoining the long edge, wherein the first portion has a first depth; and
   a second portion adjoining the short edge, wherein the second portion has a second depth greater than the first depth.

7. The device of claim 1, wherein the semiconductor fin comprises germanium, and wherein the semiconductor substrate is a silicon substrate.

8. A device comprising:
   a silicon substrate;
   Shallow Trench Isolation (STI) regions extending into the silicon substrate; and
   a semiconductor fin between the STI regions, wherein the semiconductor fin is higher than neighboring portions of the STI regions, and wherein the STI regions comprise a top surface comprising:
   a first portion being substantially flat; and
   a second portion connecting a bottom of the fin to the first portion of the top surface, wherein the second portion of the top surface is lower than the first portion of the top surface.

9. The device of claim 8, wherein the STI regions comprises:
   germanium-containing STI portions, wherein the second portion of the top surface is a top surface of the germanium-containing STI portions; and
   germanium-free STI portions, wherein the first portion of the top surface is a top surface of the germanium-free STI portions.

10. The device of claim 9, wherein the germanium-containing STI portions extend underlying the respective adjacent one of the germanium-free STI portions.

11. The device of claim 8, wherein the wherein the semiconductor fin comprises silicon germanium.

12. The device of claim 8, wherein a ditch is formed in the STI regions, and wherein the ditch forms a full ring encircling the semiconductor fin.

13. The device of claim 8, wherein the second portion of the top surface is gradually and smoothly transitioned from the bottom of the semiconductor fin to the first portion of the top surface, and gradually increases in height.

14. The device of claim 8, wherein the second portion of the top surface has a cross-sectional shape close to a quarter of a circle.

15. The device of claim 8, wherein the semiconductor fin has a long edge and a short edge, wherein the second portion of the top surface is in a ditch in the STI regions, and wherein the ditch comprises:
   a first portion adjoining the long edge, wherein the first portion has a first depth; and
   a second portion adjoining the short edge, wherein the second portion has a second depth greater than the first depth.

16. A method comprising:
   recessing a portion of a semiconductor substrate between isolation regions to form a recess in the semiconductor substrate;
   performing an epitaxy to grow a semiconductor region in the recess; and
   recessing the isolation regions, wherein a top portion of the semiconductor region over the isolation regions forms a semiconductor fin, and wherein a ditch is formed simultaneously when the step of recessing the isolation regions is performed, with the ditch being in the isolation regions and adjoining the semiconductor fin.

17. The method of claim 16 further comprising:
   forming recesses in the semiconductor substrate to form trenches;
   depositing a germanium-containing layer in the trenches;
   filling the trenches with a dielectric material to form the isolation regions; and
   before the step of recessing the isolation regions, performing an annealing to diffuse the germanium-containing layer into the isolation regions.

18. The method of claim 16 further comprising, after the epitaxy and before the step of recessing the isolation regions, performing an annealing on the semiconductor region and the isolation regions.

19. The method of claim 16, wherein the step of recessing the isolation regions is performed through an isotropic etching.

20. The method of claim 19, wherein the step of recessing the isolation regions is performed through a wet etching, with a hydrogen fluoride (HF) solution used as an etchant.

* * * * *